(12) United States Patent
Zhang

(10) Patent No.: US 6,975,255 B1
(45) Date of Patent: Dec. 13, 2005

(54) RANDOM INTERLEAVING DITHER FOR SIGMA-DELTA ANALOG-TO-DIGITAL CONVERTERS

(75) Inventor: Weibiao Zhang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/947,039

(22) Filed: Sep. 21, 2004

(51) Int. Cl.[7] .............................................. H03M 1/20
(52) U.S. Cl. ...................... 341/131; 341/143; 341/155
(58) Field of Search ................................ 341/131, 143, 341/155

(56) References Cited

U.S. PATENT DOCUMENTS 6,049,299 A * 4/2000 Lunacek et al. ............ 341/131
6,331,831 B1 * 12/2001 Cvetkovic et al. .......... 341/131
6,825,784 B1 * 11/2004 Zhang ........................ 341/131

OTHER PUBLICATIONS

Norsworthly et al "A 14-Bit 80kHz Sigma-Delta A/D Converter:Modeling, Design, and Performance Evaluation" IEEE Journal of Solid-State Circuit vol. 24, No. 2, Apr., 1998, pp 256-266.*
Norsworthy et al "Delta Sigma Data Converters Theory, Design and Simulation" IEEE Circuits & Systems Society, pp98-108 (no date).*
Norsworth et al. "Effective Dithering of Sigma Delta Modulations" IEEE 1992 pp 1304-1307 (no date).*
Gomez "A 102-db Spurious-Free DR EA ADC Using a Dynamic Dither Scheme" IEEE Transactions on Circuit & Systems, vol. 47, Jun. 2000, pp 531-535.*

* cited by examiner

*Primary Examiner*—Don Le
*Assistant Examiner*—Lam T. Mai
(74) *Attorney, Agent, or Firm*—Abdul Zindani; W. James Brady, III; Frederick J. Telecky, Jr.

(57) ABSTRACT

A dithering method is provided for sigma-delta converters in a deep-submicron process. The dither is a random interleaving of quantizer thresholds levels. The random interleaving dither is more effective than previous static dither methods to remove idle channel tones of sigma-delta analog-to-digital converters (ADC). The dither is easy to implement and takes less area than other dynamic dither methods.

21 Claims, 6 Drawing Sheets

RANDOM INTERLEAVING DITHER FOR SIGMA-DELTA ANALOG-TO-DIGITAL CONVERTERS

BACKGROUND OF THE INVENTION

1. Field of the Invention

This invention relates generally to dithering techniques, and more particularly to a method of dithering for sigma-delta analog-to-digital converters.

2. Description of the Prior Art

Idle channel tones are known to exist in sigma-delta converters. A second-order sigma-delta modulator 100 architecture is shown in FIG. 1. The converter includes two integrators 102, 104 and two negative feedback loops 106, 108, k1 and k2 are forwarding coefficients; $k_{f1}$ and $k_{f2}$ are feedback coefficients. When input x(n) is a small DC signal or some small DC offset: if the channel is idle, the output y(n) of the sigma-delta modulator would be a series of digital codes that has a low frequency pattern. The frequency is proportional to the input DC offset and the sampling clock frequency. In audio applications, the tones could lead to unpleasant sound when there is only DC offset and/or a very low frequency (several Hz) signal with a very small amplitude.

Many dithering methods have been proposed for reducing idle channel tones: Some of these include (1) adding an out-of-band sine or square wave; (2) adding a DC offset to the input of the modulator; (3) adding a small amount of white noise to the input x; (4) adding a small-amplitude periodic pulse train; and (5) starting the integrators with irrational values. The above techniques are generally either too complicated to implement or not desirably effective.

In view of the foregoing, it would be highly desirable and advantageous to provide a dithering technique that is more effective than known static dithering techniques to remove idle channel tones associated with sigma-delta analog-to-digital converters.

SUMMARY OF THE INVENTION

The present invention is directed to a dithering method for sigma-delta converters in a deep-submicron process. The dither is a random interleaving of quantizer thresholds levels. The random interleaving dither is more effective than previous static dither methods to remove idle channel tones of sigma-delta analog-to-digital converters (ADC). The dither is easy to implement and takes less area than other dynamic dither methods.

More specifically, idle channel tones of a sigma-delta ADC are removed by destroying the periodicity of the ADC digital output codes. This periodicity is destroyed by interleaving two different sets of signal levels randomly to the quantizer decision thresholds when the ADC input is a DC offset only. These two different sets of signal levels determine whether the decision window is stretched or shifted, and also the direction in which the window will be moved or in which direction the window will be stretched.

According to one embodiment, a method of reducing idle channel tones in a sigma-delta analog-to-digital converter (ADC) comprises interleaving a plurality of signal levels randomly to quantizer decision thresholds such that the periodicity of the converter's digital output codes are removed when the converter input signal is only a DC offset, wherein at least one signal level is associated solely with a fixed threshold window interval and at least one different signal level is associated solely with a varied threshold window width.

According to another embodiment, a method of reducing idle channel tones in a sigma-delta analog-to-digital converter (ADC) comprises the steps of: generating a first signal set to determine whether a quantizer decision window is stretched or shifted; generating a second signal set to determine the direction in which the window will moved when it is stretched or how much the window will be shifted when it is shifted; and interleaving the first and second signal sets randomly to the quantizer decision threshold such that the periodicity of the ADC's digital output codes are removed when the ADC input signal is only a DC offset.

According to yet another embodiment, a sigma-delta analog-to-digital converter (ADC) with non-periodic output codes comprises: a signal generator operational to generate a series of binary numbers; a pseudorandom signal generator operational to generate a pseudorandom binary code; a quantizer; and a decoder operational to interleave quantizer threshold input signals in response to the series of binary numbers and the pseudorandom binary code, such that the quantizer generates the non-periodic output code to remove idle channel tones when the ADC input signal comprises solely a DC offset.

According to still another embodiment, a sigma-delta analog-to-digital converter (ADC) with non-periodic output codes comprises: means for generating a first signal set; means for generating a second signal set; and means for generating the non-periodic output codes in response to the first and second signal sets to remove idle channel tones when the ADC input signal comprises solely a DC offset.

According to still another embodiment, a sigma-delta analog-to-digital converter (ADC) comprises: a quantizer; and means for randomly shifting or stretching the quantizer decision threshold window to destroy the periodicity of the ADC output signal whenever the ADC input signal consists of a DC offset.

BRIEF DESCRIPTION OF THE DRAWINGS

Other aspects and features of the present invention and many of the attendant advantages of the present invention will be readily appreciated as the invention becomes better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 2:
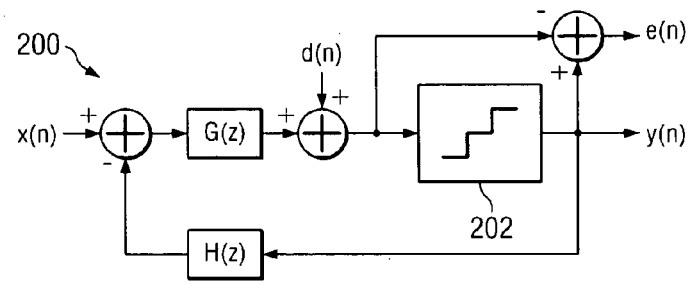
FIG. 2 illustrates a single-stage sigma-delta modulator with dither that is known in the art.

In order to facilitate a better understanding of the preferred embodiments described herein below, a background is first set forth with reference to FIGS. 2–7, describing how dithering techniques are applied to sigma-delta converters. An effective dithering method is noise-shaped, namely to add dither in such a way that the dither transfer function is the same as the quantization transfer function. Looking now at FIG. 2, a single stage sigma-delta modulator 200 is depicted with dither (generalized dither). In FIG. 2, x(n) and y(n) are the input and output respectively of the modulator 200. G(z) is the feedforward Z transfer function and H(z) is the feedback transfer function. A pseudorandom series dither d(n) is added to the input of the quantizer 202.

Figure 1:
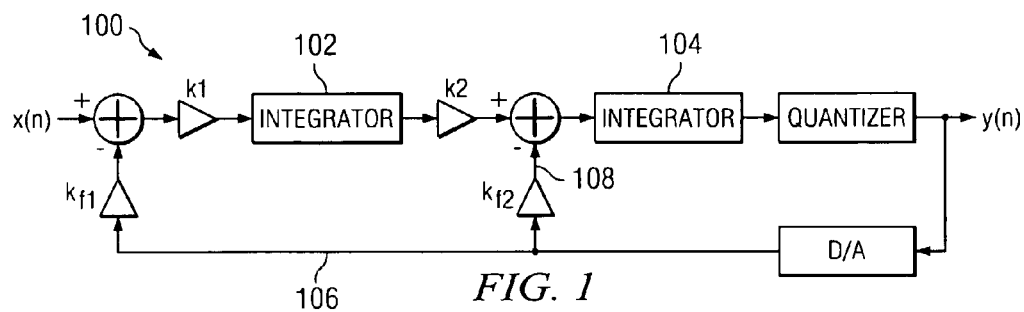
FIG. 1 illustrates a second-order analog-to-digital modulator that is known in the art.
Figure 3:
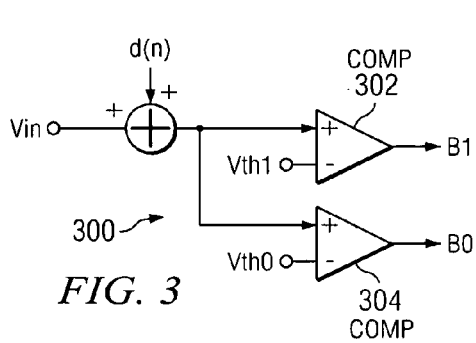
FIG. 3 illustrates a dither added in front of a 3-level quantizer that is known in the art.

FIG. 3 shows the dither to a 3-level quantizer 300. Normally Vth0=−Vth and Vth1=Vth. In FIG. 3, a pseudorandom series dither d(n) is added to the quantizer 300 input. When the comparators 302, 304 input (Vin+d(n)) is bigger than Vth, B1B0=11, Vref is fed back to the first and the second integrators 102, 104 shown in FIG. 1; When Vin+d(n) is less than or equal to Vth and greater than −Vth, B1B0=01, and 0 is fed back to the first and the second integrators 102, 104; When Vin+d(n) is less than −Vth, B1B0=00 and −Vref is fed back to the integrators 102, 104. Vref is the reference voltage for the converter 100. The full swing of the input to the converter 100 is +/−Vref.

Without dither (d(n)=0 for all n), the decision threshold window for the quantizer 300 is (−Vth, Vth). With dither series d[n], the window is shifted to (−Vth−d[n], Vth−d[n]). When d[n] is a pseudorandom series, the window shifts randomly and the output sequence de-correlates. Thus, the periodicity of the output series y[n] is destroyed and the idle channel tones are removed.

From literature and simulations, the dithering amplitude must be big enough to remove the idle channel tones (for a 1-bit quantizer, δ/Δ>0.5, δ is the peak-to-peak range of the dither, and Δ is the quantizer interval). The dynamic range is degraded by several dB when dither peak-to-peak range δ is equal to quantizer interval Δ.

Figure 4:
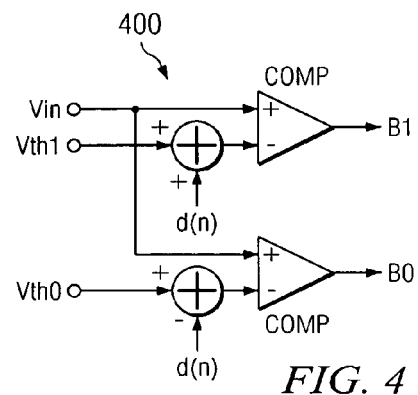
FIG. 4 illustrates a stretching window dither in a 3-level quantizer that is known in the art.

One stretching window dithering technique that was proposed by the present inventor is shown in FIG. 4. When the dither is applied, the threshold window or interval is stretching instead of shifting. The dither d(n) is added in front of the quantizer 400 and has the same transfer function as the quantization noise transfer function. The dither in FIG. 3 has a fixed threshold interval (2*Vth) regardless of the d[n] value; the dither in FIG. 4 has a varied threshold window width depending on the dither d[n]. The window is expanding when d[n]>0 and shrinking when d[n]<0. When d[n] is a pseudorandom series, the decision window stretches randomly and destroys the periodicity of the output series.

Both dithers described herein before with reference to FIGS. 3 and 4 removed the idle channel tones. Given the same dither energy for the two dithers discussed herein above, a stretching window dither has a better signal-to-noise-plus-distortion-ratio (SNDR) performance for an input close to the full scale.

Figure 5:
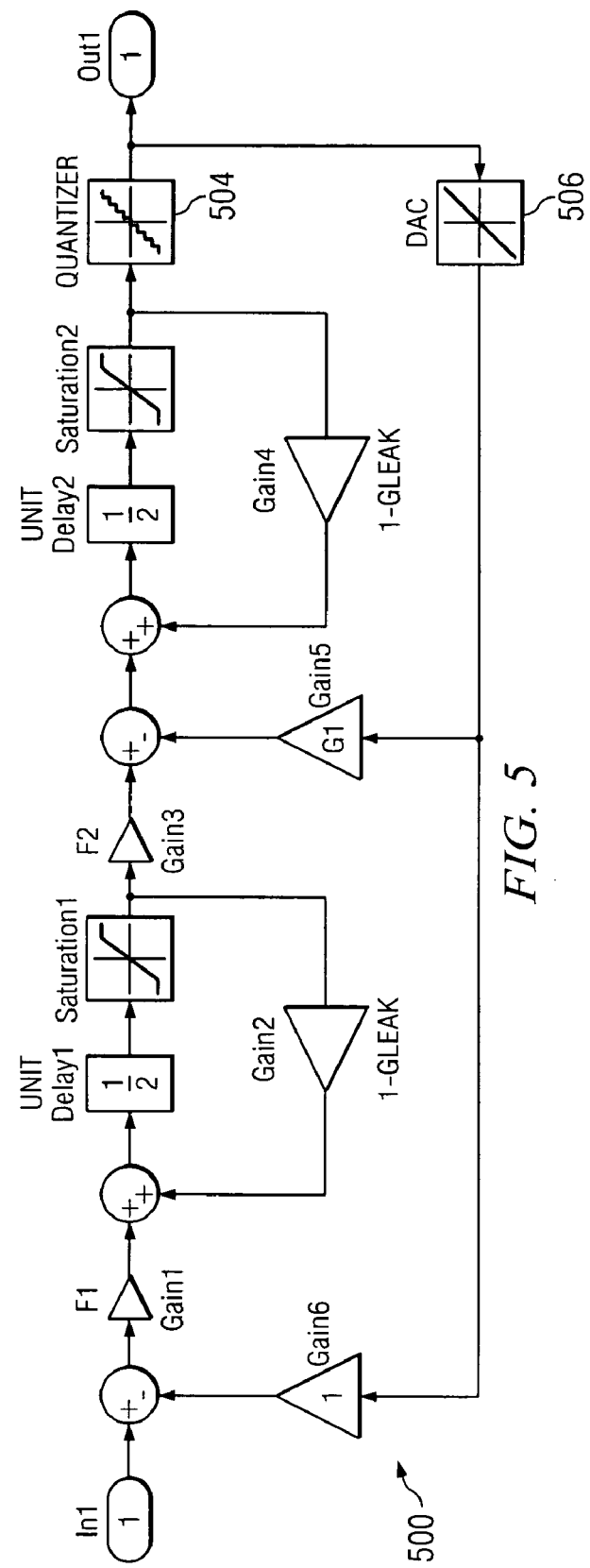
FIG. 5 illustrates a model for a second-order sigma-delta modulator with leaky integrators that is known in the art.
Figure 6A:
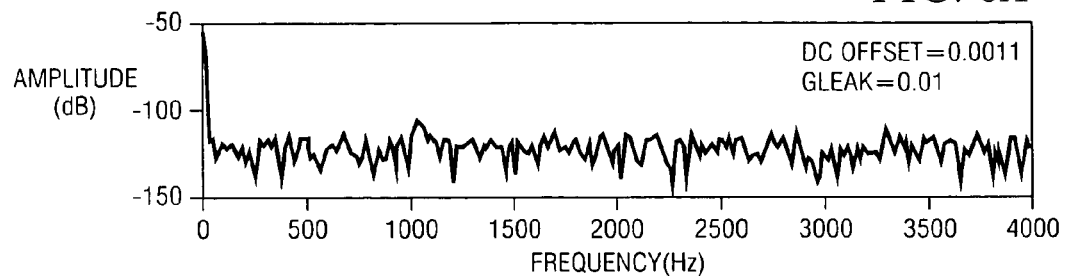
FIGS. 6a–6c illustrate idle channel tones with leakage factors.
Figure 6B:
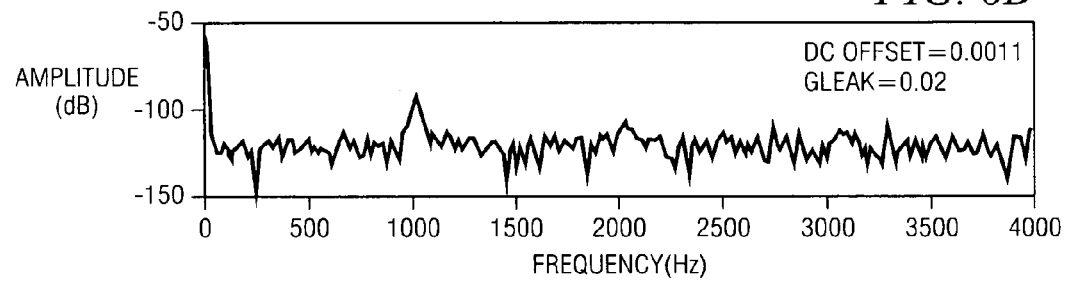
Figure 6C:
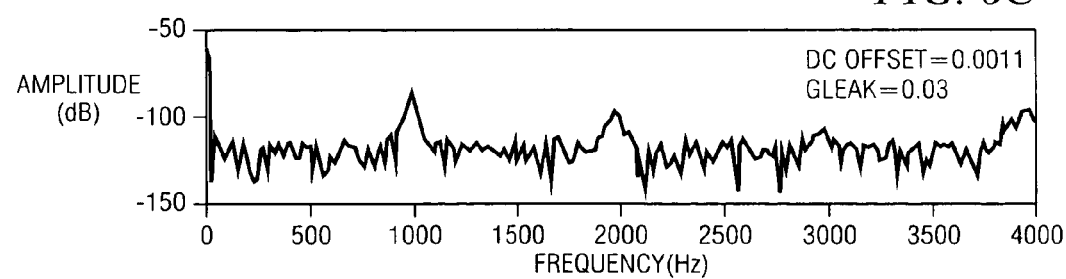

In deep-submicron CMOS processes, linear capacitors are normally implemented via Metal-Insulator-Metal (MIM) capacitors by inter digitizing metal fingers spaced by oxide dielectrics. The space is normally very small in order to get higher capacitance per unit area. This can lead to the leakage of the integrator (i.e., 102, 104 in FIG. 1). FIG. 5 shows a model for a second-order sigma-delta modulator 500 with leaky integrators FIGS. 6a–6c show simulation results for the idle channel tones when Gleak=0.01 to 0.03 using a 0.01 step. F1=1/6, F2=3/4, G1=1/4, the quantizer 504 is a three level quantizer with Vth1=1/8, Vth0=−1/8 and the DC offset is fixed. The DAC 506 full scale is +/−2 V. It is obvious that with the increase of the leakage, the idle channel tone effect is becoming stronger. When Gleak=0.01, the idle channel tones around 1000 Hz are less than −105 dB; this is increased to −85 dB when Gleak=0.03.

Figure 7A:
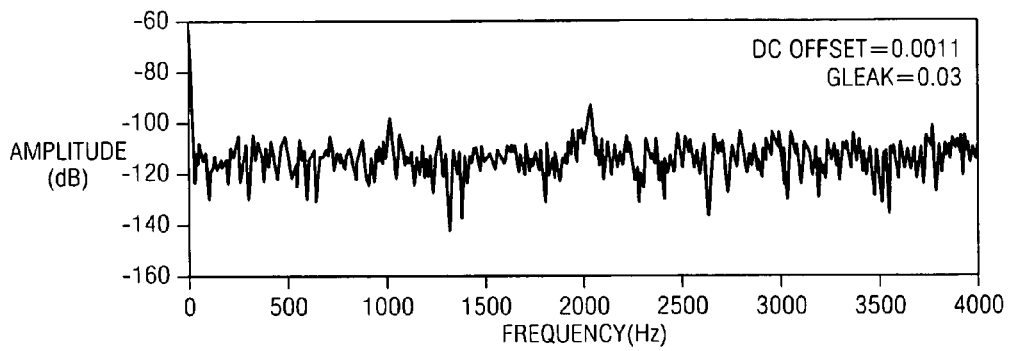
FIGS. 7a–7b illustrate idle channel tones with leaky integrators and dithers known in the art.
Figure 7B:
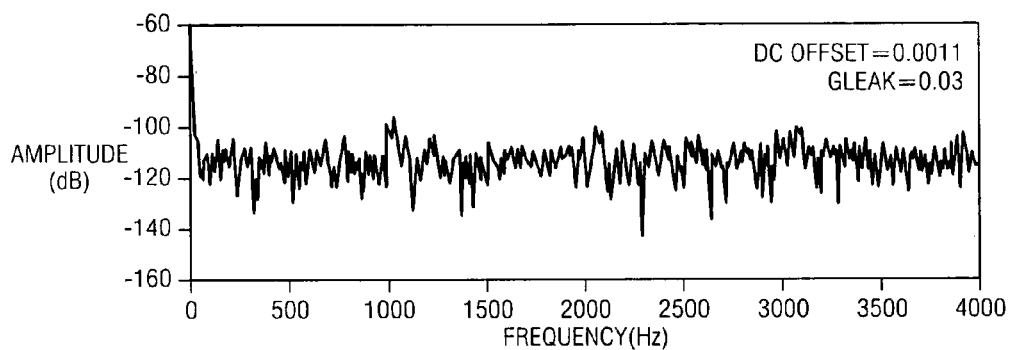

Dithering was found by the present inventor to help reduce the idle channel tones in deep-submicron processes. FIGS. 7a–7b show the idle channel tones reduced by the dithers shown in FIGS. 3 and 4 respectively when Gleak=0.03. The highest tone energy is −94 dB when the dither in FIG. 3 is applied and −95 dB when the dither in FIG. 4 is applied.

Figure 8:
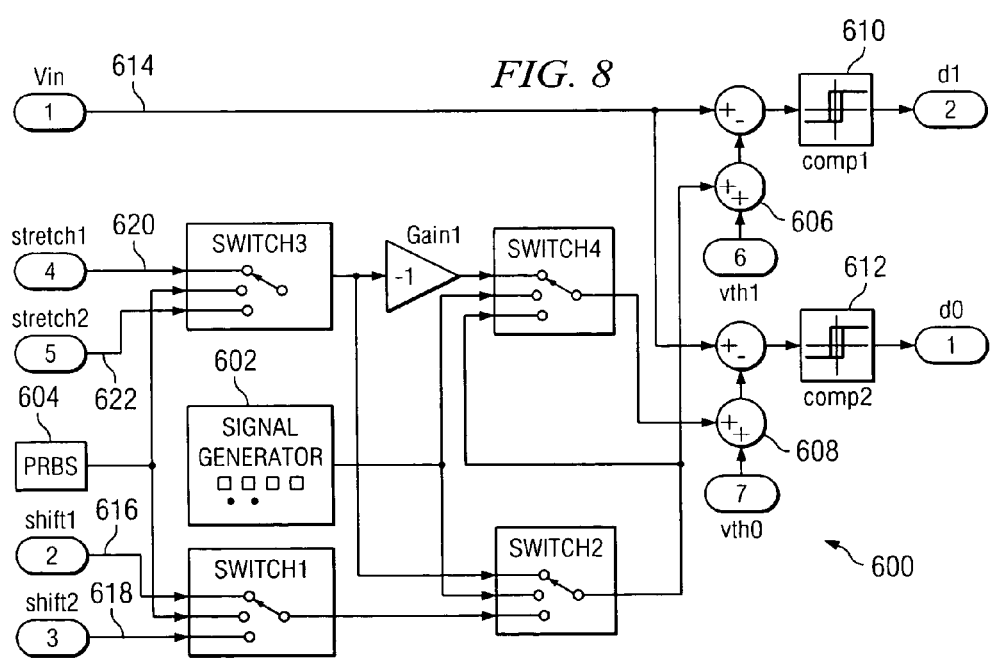
FIG. 8 illustrates a dither in a 3-level quantizer according to one embodiment of the present invention.

Both dithers in FIG. 3 and FIG. 4 move the decision threshold window (either shifting or stretching) to destroy the periodicity of the output series. The present inventor alone recognized that it would be more effective to interleave the two moves randomly as described herein below with reference now to FIGS. 8–12. Looking now at FIG. 8, a 3 level quantizer 600 is shown that employs dithering in accordance with interleaving principles described now herein below. In FIG. 8, a signal generator 602 generates a series of 0s and 1s to select whether the decision window is stretched or shifted. A pseudorandom generator 604 generates a series of pseudorandom codes to select which direction the window will be moved or which direction the window will be stretched. The switches 1, 2, 3 and 4 are identical function blocks. When the middle left port is 0, its bottom left input port is passed to the output port, the right port. When the middle left port is 1, its top left input port is passed to the output port. The outputs of switch 2 and switch 4 are fed to the summers 606, 608 respectively in order to form the decision window. Normally Vth1=Vth, and Vth0=−Vth. Blocks comp1 and comp2 are comparators 610, 612; they generate a digital output of 1 if its respective input is greater than 0, and a digital output of 0 when its respective input is less than 0. Vin 614 is an analog input signal. The input signals shift1, shift2, stretch1 and stretch2 616, 618, 620, 622 respectively, are analog signals that can be interleaved to the comparators 610, 612 by the signal generator 602.

Figure 9:
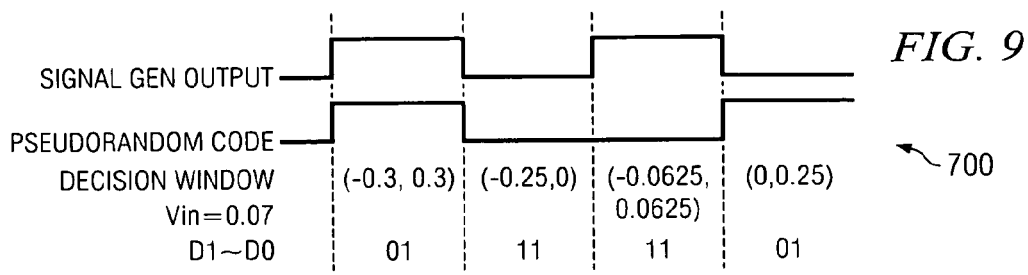
FIG. 9 illustrates a timing diagram for a 3-level quantizer with a fixed input associated with the dither shown in FIG. 8.

FIG. 9 shows one example of a timing diagram 700 for the signals shown in FIG. 8 (for a 3-level quantizer with fixed input). Here Vth1=0.125, Vth0=−0.125, shift1=0.125, shift2=−0.125, stretch1=0.175, stretch2=−0.0625 and Vin=0.07. It is obvious that the output codes are not the same although the input is fixed, this helps to destroy the periodicity of the idle channel outputs. The output codes can be seen to exhibit more random behavior for a given DC input to the modulator with interleaving of two different movements of decision windows. It should be noted that the total dither power is not increased since the dithers are time divided and the SNR penalty for high input amplitude region is as good as one dither.

Figure 10:
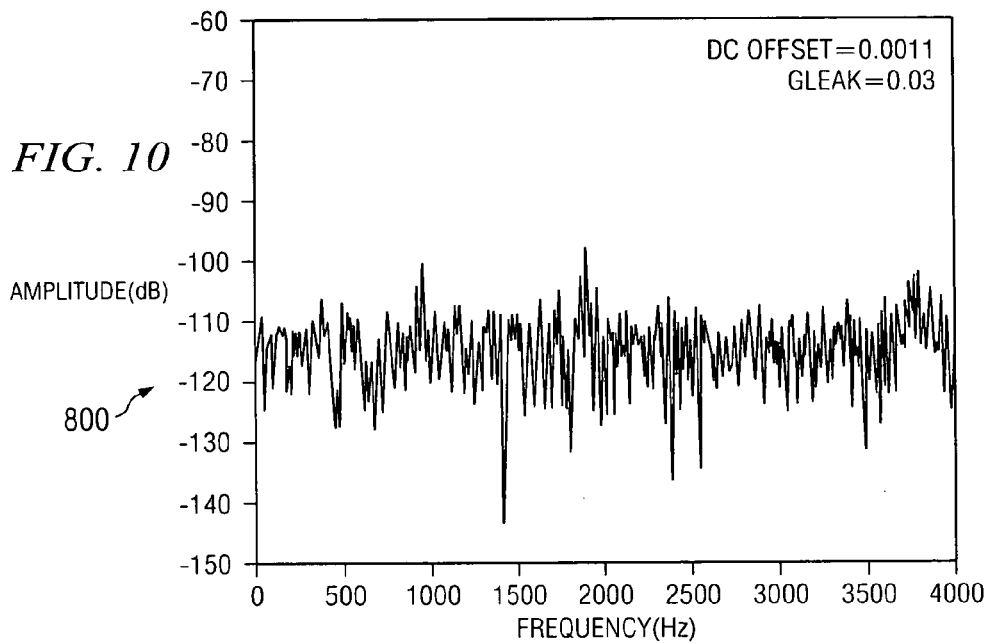
FIG. 10 illustrates idle tones using leaky integrators and the dither shown in FIG. 8.

FIG. 10 shows the idle channel tones 800 when using the dithering technique 600 shown in FIG. 8 using leaky integrators. Using same leakage factor, the inventive dither reduced the tone energy to below −97 dB, 2~3 dB better than the dithers described with reference to FIG. 3 or FIG. 4.

Figure 11:
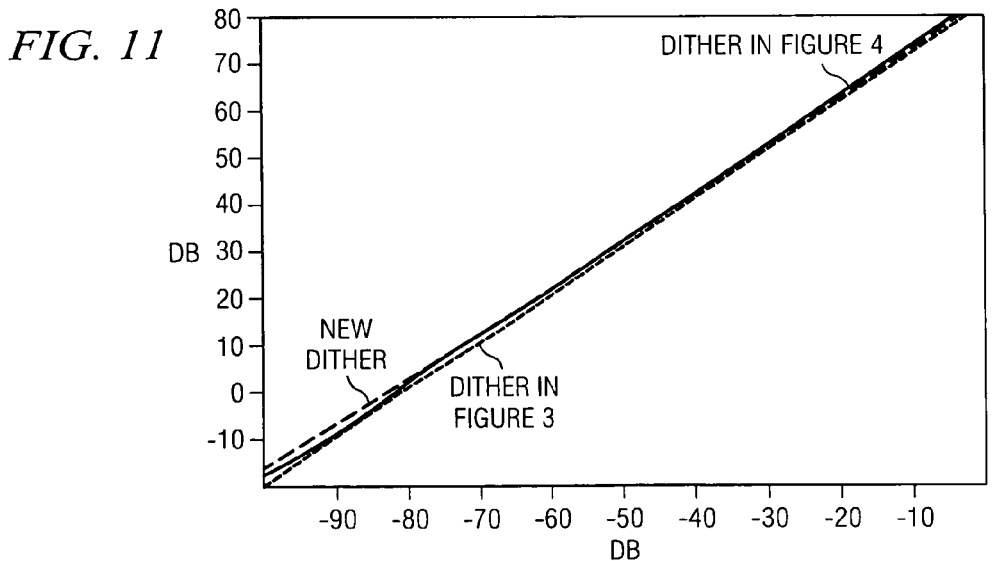
FIG. 11 illustrates a signal-to-noise plus distortion ratio (SNDR) versus input amplitude plot for a given sine wave input.
Figure 12:
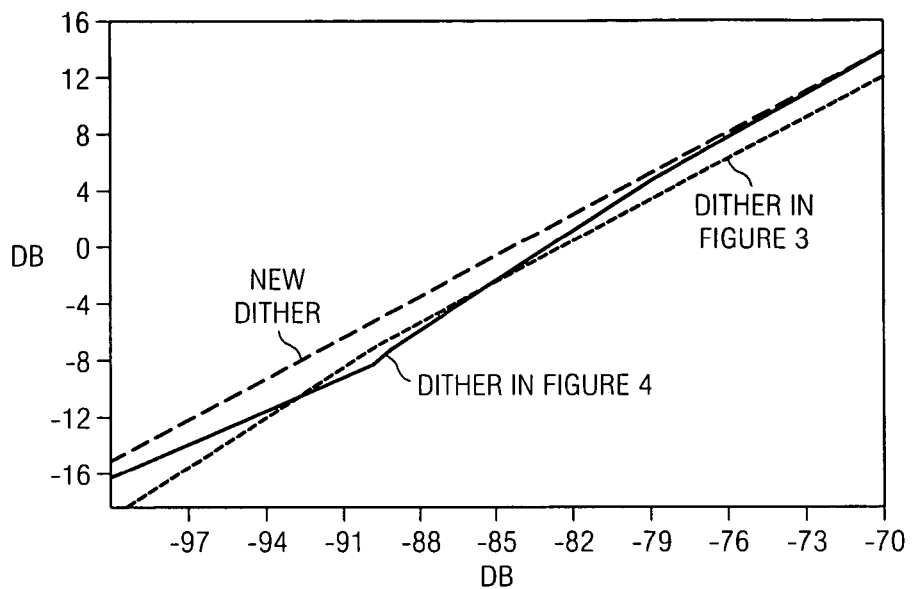
FIG. 12 illustrates another SNDR versus input amplitude plot for a given sine wave input.

FIGS. 11 and 12 show the SNDR (Signal-to-Noise-plus-Distortion-Ratio) vs. input amplitude for a given sine wave input when dithers are applied to the converter with leaky integrators (Gleak=0.03). The SNDR curve for the dither 600 is above the SNDR curve of the old dithers associated with FIGS. 3 and 4, especially when the input amplitude is small. This is more useful, because in real applications, idle channel tones appear when the input is a very small DC signal or a slow moving small amplitude signal. This shows that the dither 600 is more effective to remove the idle channel tones. Even with a leaky integrator, the dither 600 performed very well. This makes it therefore, a good candidate for deep-submicron processes with leaky integrators.

In summary explanation, a dithering method 600 that removes the idle channel tones of a sigma-delta converter was described. The converter idle channel tones are reduced or removed by interleaving decision threshold levels to achieve randomly stretching decision windows and shifting windows of the quantizer. Comparing with known dithering methods, the preferred embodiments are more effective in removing the idle channel tones.

Figure 13:
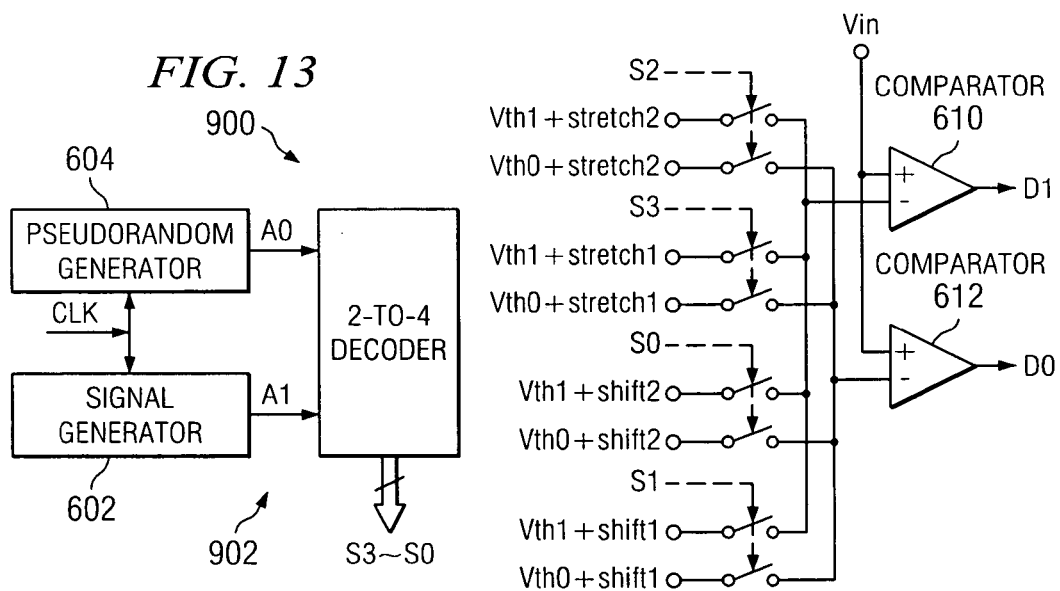
FIG. 13 illustrates a circuit implemented in silicon to implement the dither shown in FIG. 8.

Moving now to FIG. 13, a circuit diagram illustrates a dithering technique 900 according to one embodiment of the present invention implemented in silicon and that employs decoding logic 902 to switch in the required threshold inputs to the comparators 610, 612. The present invention is not so limited however, and those skilled in the art will readily appreciate that many variations and flavors of circuits can be easily employed to implement a dithering technique according to the principles discussed herein before. Although FIG. 9 shows a square wave output from the signal generator 602 shown in FIG. 8, the signal generator 602 can also generate an output comprising a random series of 0s and 1s. Such a square wave generator is easy to implement and the effectiveness is not compromised. The pseudorandom generator 604 generates a random signal A0 (a series of 0s and 1s randomly), while signal generator 602 generates a digital signal A1 (can be 0 or 1). The 2-to-4 decoder 902 translates the A1A0 to 4 outputs S3–S0 as shown in the table below.

TABLE

Decoder Translation

| A1A0 | S3 | S2 | S1 | S0 |
|------|----|----|----|----|
| 00   | 0  | 0  | 0  | 1  |
| 01   | 0  | 0  | 1  | 0  |
| 10   | 0  | 1  | 0  | 0  |
| 11   | 1  | 0  | 0  | 0  |

In view of the above, it can be seen the present invention presents a significant advancement in the dithering art associated with sigma-delta converters. This invention has been described in considerable detail in order to provide those skilled in the sigma-delta analog-to-digital converter arts with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A method of reducing idle channel tones in a sigma-delta analog-to-digital converter (ADC) comprises interleaving a plurality of signal levels randomly to quantizer decision thresholds such that the periodicity of the converter's digital output codes are removed when the converter input signal is only a DC offset, wherein at least one signal level is associated solely with a fixed threshold window interval and at least one different signal level is associated solely with a varied threshold window width.

2. The method according to claim 1, wherein the plurality of signal levels are applied to the quantizer input to determine whether a decision threshold window is shifted or stretched.

3. The method according to claim 2, wherein the plurality of signal levels are applied to the quantizer input to further determine which direction the decision threshold window will be moved when the decision threshold window is shifted and in which direction the decision threshold window will be stretched when the decision threshold window is stretched.

4. The method according to claim 1, wherein the plurality of signal levels are generated via a signal generator to generate an output code to select whether the decision window is stretched or shifted.

5. The method according to claim 4, wherein the plurality of signal levels are further generated via a pseudorandom generator to generate a pseudorandom code to select which direction the window will be moved or stretched.

6. A method of reducing idle channel tones in a sigma-delta analog-to-digital converter (ADC), the method comprising the steps of:
generating a first signal set to determine whether a quantizer decision window is stretched or shifted;
generating a second signal set to determine the direction in which the window will moved when it is stretched or how much the window will be shifted when it is shifted; and
interleaving the first and second signal sets randomly to the quantizer decision threshold such that the periodicity of the ADC's digital output codes are removed when the ADC input signal is only a DC offset.

7. The method according to claim 6, wherein the step of generating a first signal set to determine whether a quantizer decision window is stretched or shifted comprises generating a series of zeros and ones via a square wave signal generator.

8. The method according to claim 6, wherein the step of generating a second signal set to determine the direction in which the window will moved when it is stretched or how much the window will be shifted when it is shifted comprises generating a series of pseudorandom code via a pseudorandom signal generator.

9. The method according to claim 6, wherein the step of interleaving the first and second signal sets randomly to the quantizer decision threshold such that the periodicity of the ADC's digital output codes are removed when the ADC input signal is only a DC offset comprises interleaving the first and second signal sets randomly to a plurality of comparators, wherein each comparator generates an output code, and further wherein the comparator output codes are combined to generate the ADC digital output codes.

10. A sigma-delta analog-to-digital converter (ADC) with non-periodic output codes, the ADC comprising:
- a signal generator operational to generate a series of binary numbers;
- a pseudorandom signal generator operational to generate a pseudorandom binary code;
- a quantizer; and
- a decoder operational to interleave quantizer threshold input signals in response to the series of binary numbers and the pseudorandom binary code, such that the quantizer generates the non-periodic output code to remove idle channel tones when the ADC input signal comprises solely a DC offset.

11. The sigma-delta ADC according to claim 10, wherein the quantizer comprises a plurality of comparators.

12. A sigma-delta analog-to-digital converter (ADC) with non-periodic output codes, the ADC comprising:
- means for generating a first signal set;
- means for generating a second signal set; and
- means for generating the non-periodic output codes in response to the first and second signal sets to remove idle channel tones when the ADC input signal comprises solely a DC offset.

13. The sigma-delta ADC according to claim 12, wherein the first signal set comprises a dither having solely a fixed threshold interval.

14. The sigma-delta ADC according to claim 12, wherein the second signal set comprises a dither having solely a varied threshold window width.

15. The sigma-delta ADC according to claim 12, wherein the means for generating the non-periodic output codes comprises a quantizer.

16. The sigma-delta ADC according to claim 12, wherein the means for generating the non-periodic output codes comprises a plurality of comparators.

17. A sigma-delta analog-to-digital converter (ADC) comprising:
- a quantizer; and
- means for randomly shifting or stretching the quantizer decision threshold window to destroy the periodicity of the ADC output signal whenever the ADC input signal consists of a DC offset.

18. The sigma-delta ADC according to claim 17, wherein the quantizer comprises a plurality of comparators.

19. The sigma-delta ADC according to claim 17, wherein the means for randomly shifting or stretching the quantizer decision threshold window comprises:
- a first signal generator operational to generate a an output signal to determine whether the decision window is stretched or shifted; and
- a second signal generator operational to generate an output signal to determine in which direction the decision window will be shifted or in which direction the decision window will be stretched.

20. The sigma-delta ADC according to claim 19, wherein the second signal generator comprises a pseudorandom code generator.

21. The sigma-delta ADC according to claim 19, wherein the means for randomly shifting or stretching the quantizer decision threshold window operates to randomly interleave the first signal generator output signal and the second signal generator output signal.

* * * * *